(12) United States Patent
Chen (10) Patent No.: US 7,466,523 B1
(45) Date of Patent: Dec. 16, 2008

(54) NANOTUBE SPIN VALVE AND METHOD OF PRODUCING THE SAME

(76) Inventor: Yingjian Chen, 1123 Wisteria Dr., Fremont, CA (US) 94539

( * ) Notice: Subject to any disclaimer, the term of this patent is extended or adjusted under 35 U.S.C. 154(b) by 1386 days.

(21) Appl. No.: 10/617,015

(22) Filed: Jul. 10, 2003

(51) Int. Cl.
- *G11B 5/39* (2006.01)
- *B05D 3/00* (2006.01)
- *D01F 9/12* (2006.01)
- *G11C 11/02* (2006.01)

(52) U.S. Cl. .................. 360/324.1; 977/742; 423/447.1; 365/158

(58) Field of Classification Search ............ 360/324.1, 360/324.11, 324.12; 977/932–935, 942, 977/742; 423/447.1; 365/158
See application file for complete search history.

(56) References Cited

U.S. PATENT DOCUMENTS

| | | | |
|---|---|---|---|
| 5,424,054 A * | 6/1995 | Bethune et al. | 423/447.2 |
| 6,430,511 B1 * | 8/2002 | Tour et al. | 702/19 |
| 6,828,039 B2 * | 12/2004 | Sugawara | 428/621 |
| 6,833,980 B1 * | 12/2004 | Tsukagoshi et al. | 360/324 |
| 6,876,574 B2 * | 4/2005 | Giebeler et al. | 365/158 |
| 6,917,493 B2 * | 7/2005 | Clinton et al. | 360/125.02 |
| 6,920,014 B2 * | 7/2005 | Sato et al. | 360/234.5 |
| 7,215,516 B2 * | 5/2007 | Yoshikawa et al. | 360/324.11 |
| 7,379,326 B2 * | 5/2008 | Ushida et al. | 365/158 |
| 2001/0019238 A1 | 9/2001 | Dai et al. | |
| 2003/0087130 A1 * | 5/2003 | Sugawara | 428/692 |
| 2003/0123189 A1 * | 7/2003 | Sato et al. | 360/234.5 |
| 2003/0142440 A1 * | 7/2003 | Clinton et al. | 360/123 |
| 2004/0201930 A1 * | 10/2004 | Yoshikawa et al. | 360/324.1 |
| 2004/0214367 A1 * | 10/2004 | Segal et al. | 438/53 |
| 2004/0264064 A1 * | 12/2004 | Sakakima | 360/322 |
| 2005/0068679 A1 * | 3/2005 | Chen | 360/131 |
| 2006/0092542 A1 * | 5/2006 | Ushida et al. | 360/59 |

FOREIGN PATENT DOCUMENTS

JP             2004221442 A  *  8/2004

* cited by examiner

*Primary Examiner*—Brian E Miller (57) ABSTRACT

Present invention discloses novel designs of carbon nanotube spin valve structures for incorporation into magnetic storage and magnetic sensing devices, such as magnetic read head, MRAM, and magnetic field sensor. One of the designs is an in-stack carbon nanotube spin valve, which consists of a ferromagnetic free layer and a ferromagnetic pinned layer. The two layers are physically separated, although they reside in parallel planes. A single or plurality of vertically aligned carbon nanotubes are in between the two layers, and in electrical contact with both. The other design is a planar carbon nanotube spin valve, which consists of ferromagnetic free layer and pinned layer in substantially the same plane. They are electrically connected by in-plane aligned carbon nanotubes, which reside in between. The methods of fabricating the magnetic read head and MRAM devices utilizing these types of carbon nanotube spin valves are also described.

18 Claims, 6 Drawing Sheets

PRIOR ART

FIG. 8A

PRIOR ART

NANOTUBE SPIN VALVE AND METHOD OF PRODUCING THE SAME

BACKGROUND OF THE INVENTION

1. Field of the Invention

The present invention relates generally to the field of magnetic storage, and magnetic sensor devices. More particularly, to the application of magnetic recording read sensor, magnetic random access memory, and magnetic field sensors, and the manufacturing method of producing mass quantity of such devices by wafer level process.

2. Relevant Background

In normal conductors, diffusion is primarily responsible for the electron transport. Certain conductive types of carbon nanotubes are found to conduct electrons via ballistic transport. That is, the electrons are transported through the entire length of a nanotube without scattering, thus maintaining their original quantum state. This gives rise to the possibility of these types of nanotubes being utilized in devices, whose operating principle is based upon spin-polarized electron transport. Nanotube-based devices offer the potential of significantly lower power consumption, faster switching speed. Metallic nanotubes have the ability to carry a large current density of $10^9$ A/cm$^2$, which is 1000 times higher than the copper wire. This, along with the superior heat conductivity and temperature stability, can potentially enhance the long term reliability of nanotube-based devices. In addition, the ballistic transport of spin polarized electrons through the nanotubes eliminates the need for intimate contact between the magnetic electrodes, therefore offers the possibility of physically separating the pinned and free layers in a spin-valve type device.

In prior art, a CPP (current-perpendicular-to-plane) spin valve device consists of a pinned and a free ferromagnetic layer separated by a spacer layer. For a giant magnetoresistive (GMR) CPP device, the spacer layer is typically made of copper (Cu); whereas, a spin-dependent tunneling device, a tunneling barrier of alumina (AlOx) or of other metal oxide (HfOx, HfAlO, ZnOx) is used. Upon application of a bias voltage, the electrical current passes from one electrode to the other via the nonmagnetic spacer layer. The resistance of the device is a function of the relative magnetic configuration between the two ferromagnetic layers. The output of the device, which is proportional to the resistance change, is thereby dependent upon the free layer magnetization direction, and is modulated by the signal magnetic field. The physical resolution of the read sensor along the data track direction is determined, in part, by the thickness of the spin-valve film at the air bearing surface (ABS). Therefore, a reduction in the thickness of the sensor film, which is exposed at the ABS, would result in improvement in linear resolution of the read sensor.

In prior art, the use of nanotubes as current channels has been demonstrated in field effect transistor (FET) devices, as the nanotubes are randomly disposed between the source and drain electrodes. This is typically achieved by fabrication of source and drain electrodes using conventional semiconductor manufacturing process (photolithography and patterning), followed by random deposition of nanotubes on the same substrate, and relied on chance that a nanotube with the proper alignment would be found. Another alternative method that has been used in prior art is to deposit nanotubes on a substrate first. This is followed by pattern imaging and recognition using scanning electron microscopy, which was then used to guide the fabrication of contact leads around individual nanotube via e-beam lithography. Both of these techniques are not viable approaches of producing large quantity of nanotube-based devices. Both methods are disadvantageous because of the lack of control over the precise positioning and alignment of nanotubes with respect to the rest of device structure, and the lack of ability to select nanotubes of proper diameter, length, and electrical properties (metallic or semiconductive).

In prior art, the methods of growing regular array of vertically oriented nanotubes have been shown. One of these methods involves controlled growth of carbon nanotubes on pre-patterned dots of catalyst. Deposition of nanotubes into channels of anodized aluminum has also been used. Both methods can be used to fabricate vertically aligned nanotubes.

It is shown in the aforementioned prior arts that in-plane or vertically aligned nanotubes may be used as channels connecting electrodes made of conventional metals. In conventional spin-valve type devices, the pinned and free layer may be considered as ferromagnetic electrodes, which are in such intimate contact through a spacer layer that the film stack is normally fabricated in a continuous sequence of deposition steps. The linear resolution of a read head utilizing spin-valve sensor can be improved by physically separating the pinned and the free layer, and inserting only the free layer between the shields, thereby significantly reduce the read gap length. Other advantages of having separated pinned and free layer include reduced magnetic interaction between them, as well as increased ability to optimize the properties of the layers individually. The physical separation of the pinned and free layer is only possible if there is a ballistic transport mechanism between the two layers, which can be realized by incorporating nanotube channels. Therefore, there is a need in the art for designs and methods of fabrication of carbon nanotubes into spin-valve type electronic devices.

SUMMARY OF THE INVENTION

The present invention provides two basic nanotube spin-valve structures, which may be used in magnetic recording read heads, magnetic sensors, and magnetic random access memory devices. One of these structures consists of a free and a pinned ferromagnetic layers connected by vertically oriented nanotubes. It is noted as in-stack nanotube spin-valve structure. In the second structure, the two ferromagnetic electrodes are bridged by in-plane oriented nanotubes. This type of structure is noted as a planar nanotube spin-valve.

During the device operation, the electrons pass from one ferromagnetic electrode, say the pinned layer, to the other ferromagnetic electrode, which is the free layer, via the nanotube channels in between. The electrons are being conducted ballistically without losing their spin information. Upon switching of the magnetic state in the free layer due to the signal field, the resistance of the device is being modulated.

There are a number of ways to grow carbon nanotubes. Carbon arc, pulse-laser evaporation using graphite target, or chemical vapor deposition (CVD) using gaseous CO/H$_2$, or acetylene (C$_2$H$_2$)/ammonia (NH$_3$), or methane (CH$_4$) are among typically used reactants. The CVD technique is the most common method for nanotube fabrication on a wafer. In prior art, metal catalysts are typically used for growth of vertically aligned single wall nanotubes (SWNT). Therefore, it is possible to grow vertically aligned SWNT onto a ferromagnetic layer of NiFe alloy, which is also used as the free layer in a spin valve. In order to complete the in-stack spin valve structure, an insulation layer may be deposited and planerized together with the nanotubes, upon which the pinned layer is further fabricated. The planar nanotube spin valves may be fabricated in-situ using novel growth techniques directly onto a wafer, or by using novel assembly methods utilizing ex-situ grown nanotubes.

The as-grown nanotubes are typically yarn-like substance with random length and electrical properties. The product usually is a mixture of single wall (SWNT) or multi-wall nanotubes (MWNT). It is also a mixture of metallic or semiconductive nanotubes, depending on the diameter and chirality of the nanotubes. A series of techniques of tailoring the length, filtering the size, and assembly at the exact device location may be utilized to finish the nanotube spin valve device fabrication.

In the application that an in-stack nanotube spin valve used as magnetic read head, the free layer resides between the two soft magnetic shields. The pinned layer resides above the second reader shield. The nanotubes, which are vertically grown from the free layer, connect the free layer to pinned layer through the second shield. When a planar nanotube spin valve is used, the free layer extends to the ABS; whereas, the pinned layer is recessed behind the ABS, and has no overlap with the free layer. The free layer and pinned layer are connected by in-plane nanotubes.

The disclosed in-stack or planar type nanotube spin-valve structures may also be used in MRAM devices. The patterned free layer resides at the cross-section of the digit and bit lines, so that the magnetic field generated from the synchronized pulses in these two lines would switch the magnetization direction in the free layer.

BRIEF DESCRIPTION OF THE DRAWINGS

FIG. 8 illustrates a prior art magnetic random access memory (MRAM) device. A MRAM cell resides at each junction of vertically and horizontally oriented lines, as seen in FIG. 8(a). The cross-section of a MRAM cell is shown in FIG. 8(b). It is shown that a patterned magnetic tunneling junction (MTJ) is sandwiched between the bit line and the digit line.

DETAILED DESCRIPTION OF THE PREFERRED EMBODIMENTS

The purpose of present invention is providing enabling designs of integrating novel nanotube elements into magnetic and electronic devices, magnetic recording read head and MRAM devices, in particular. Because of the ability of transporting electrons ballistically by certain types of carbon nanotubes, it is possible to allow the free layer and pinned layer be physically separated, and thereby optimized independently. In magnetic recording read head application, separated free and pinned layer offers unique advantages, such as reduced read gap thickness, and disappearance of interlayer coupling. For applications in recording head, field sensor, and MRAM devices, this unique design allows independent optimization of free layer and pinned layer properties. In CPP configuration, the nanotube channels act as confined current path, which give rise to controlled device resistance. The carbon nanotube channels have superior current carrying and heat conduction capability, which will ultimately results in better signal output and device reliability.

Figure 1:
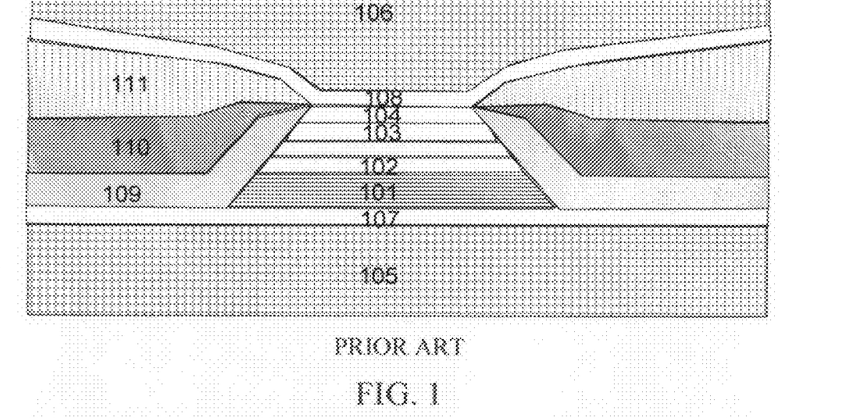
FIG. 1 illustrates a prior art spin valve read sensor, in which the current flows in the plane of the film (CIP). The current leads reside on both sides of the sensor film stack to form abutted junctions. The free layer and pinned layer, which are separated by a Cu spacer, can be seen from the air bearing surface (ABS). A first and a second insulation gaps are used to prevent current shunting from the sensor to the shields.

FIG. 1 illustrates a prior art CIP (current-in-plane) spin valve read sensor. The current leads 111 and permanent magnetic hard bias 110, and hard bias underlayer 109 reside on both sides of the sensor film stack to form abutted junctions. The underlayer is used to establish the desirable crystallographic texture of the hard bias layer grown on top. The hard bias layer provides magnetic domain stabilization in the free layer. In the film stack, the free layer 104 and pinned layer 102, which are separated by a Cu spacer 103, can be seen from the air bearing surface (ABS). The pinned layer normally has a synthetic FM/Ru/FM (ferromagnetic) layered structure. The pinning is provided by an antiferromagnetic (AFM) layer 101. A first and second insulation gaps, 107 and 108, respectively, are used to prevent current shunting from the sensor to the shields 105 and 106.

Figure 2:
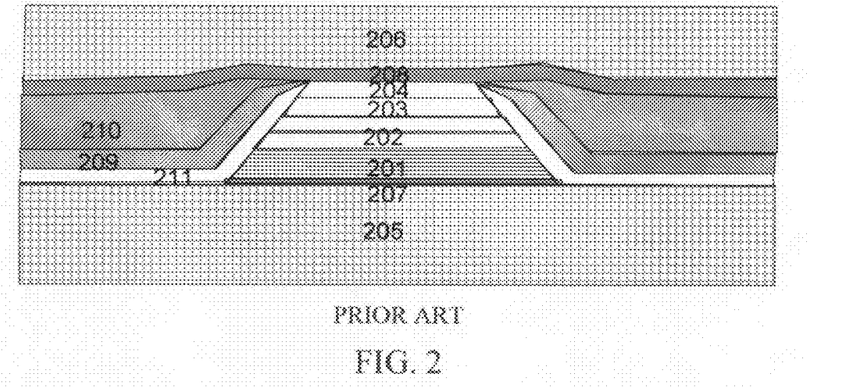
FIG. 2 illustrates another prior art spin valve read sensor, in which the current flows perpendicularly to the film plane. This is noted as CPP sensor structure. The top and bottom shield are in electrical contact with the top and bottom magnetic electrodes (pinned and free layer), respectively. At least one layer of insulation layer is used, which covers on the sidewall of the sensor stack, to prevent direct current shorting from the top shield to the bottom shield. A thin spacer layer resides between the pinned and free layer, which can be metallic in the case of a CPP spin valve, or insulator in the case of a tunneling magnetoresistive (TMR) sensor.

FIG. 2 illustrates another prior art CPP (current-perpendicular-to-plane) spin valve read sensor. In contrast to the CIP sensor, the current flows vertically through the sensor stack in a CPP sensor. Therefore, the insulating gaps as seen in FIG. 1 are replaced by electrically conductive spacers 207 and 208, which serve as the magnetic decoupling layers. The top and bottom shields 206 and 205 are in electrical contact with the top and bottom magnetic electrodes (pinned and free layer), respectively. At least one layer of insulation layer 211 is used, which covers on the sidewall of the sensor stack, to prevent direct current shorting from the top shield to the bottom shield. The hard bias layer 210 and underlayer 209 may also be used to provide magnetic stabilization for the sensor. A thin spacer layer 203 resides between the pinned and free layers 202 and 204, which can be metallic (such as Cu) in the case of a CPP spin valve, or insulator (such as $AO_x$, $ZrO_x$, $HfO_x$, or $HfAlO_x$) in the case of a tunneling magnetoresistive (TMR) sensor. In the case of a CPP spin valve, spin polarized electrons diffuse from the free layer into the pinned layer, or vice versa, and experience interface and bulk scattering in the ferromagnetic electrodes, and contribute to the change in magnetoresistance of the device. In the case of a TMR sensor, the tunneling probability through the thin dielectric barrier varies according to the relative magnetic states of the two ferromagnetic electrodes.

Figure 3:
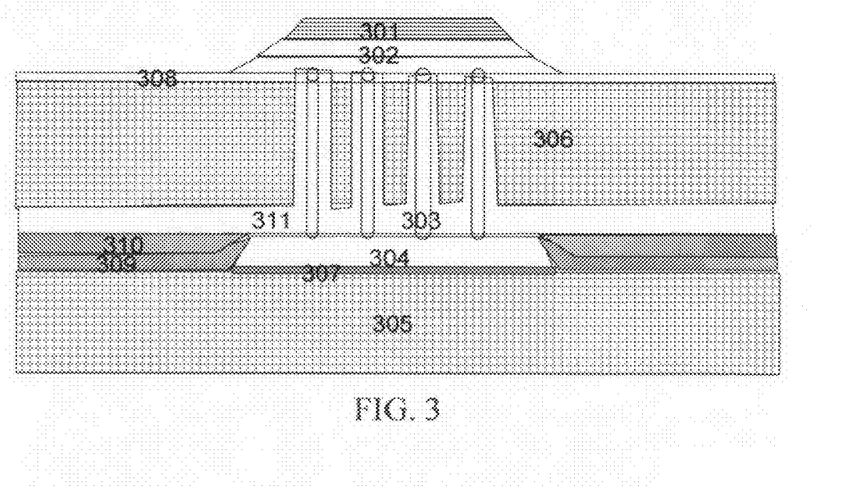
FIG. 3 shows the new in-stack nanotube spin valve in a magnetic recording read head. In this CPP type read head, the free layer, together with the hard bias materials used as domain stabilization layers, resides between the top and bottom soft magnetic shields. The pinned layer resides on top of the top shield. The nanotubes are grown vertically from the free layer, and connected to the pinned layer, through the top shield. They are electrically insulated from the top shield by a layer of dielectric insulation layer.

FIG. 3 shows the new in-stack nanotube spin valve in a magnetic recording read head of this patent. In this CPP type read head, the free layer 304, which is magnetically stabilized by the hard bias layer 310 and the underlayer 309, resides between the top and bottom soft magnetic shields 306 and 305. The pinned layer 302, on the other hand, resides on top of the top shield. The nanotubes 303 are grown vertically from the free layer 304, and connected to the pinned layer 302. The nanotubes penetrate the entire thickness of the top shield. They are, however, electrically insulated from the top shield by a layer of dielectric insulation layer 311, which is disposed on the sidewalls of the nanotubes, as well as on the hard bias layer 310. Another nonconductive layer 308 may be added in order to provide electrical insulation between the pinned layer 302 and the top shield 306.

Figure 4:
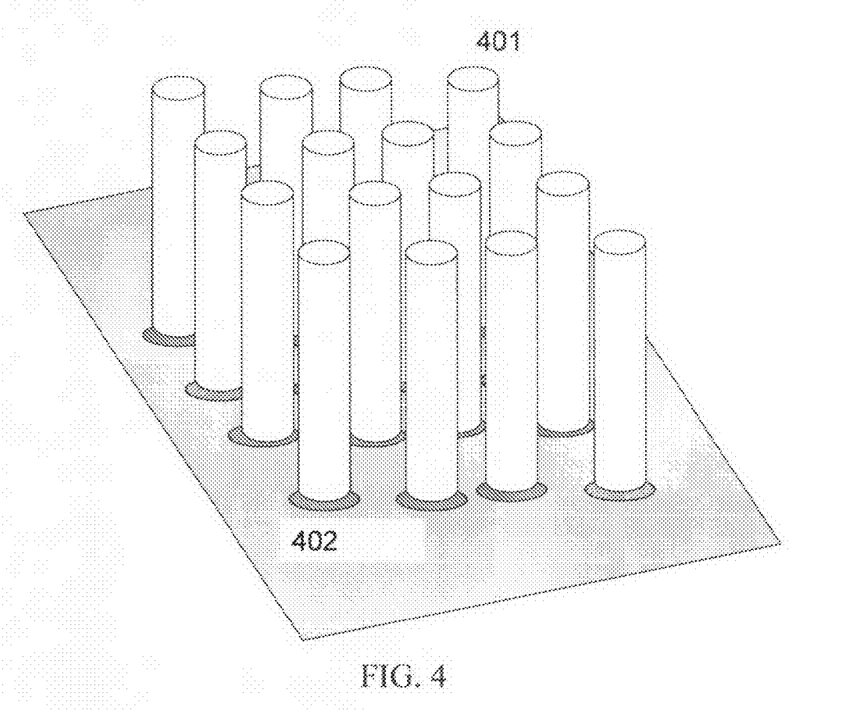
FIG. 4 shows an array of carbon nanotubes grow vertically on a patterned magnetic free layer. The NiFe materials of the free layer also act as catalysts for the vertically grown single wall nanotubes (SWNT).

FIG. 4 shows an array of carbon nanotubes 401, which are functionally the same as the nanotubes 303 seen in FIG. 3, grow vertically on a patterned magnetic free layer 402. The NiFe materials of the free layer also act as catalysts for the vertically grown single wall nanotubes (SWNT). The growth of vertically aligned SWNT using NiFe as catalyst is the key process of implementing nanotubes in the in-stack type nanotube spin valve structure. The processing sequence consists of patterning of free layer first by conventional photolithography and dry etching, which is followed by growing vertically aligned SWNT by chemical vapor deposition. A layer of thin dielectric materials is deposited to provide electrical insulation. Subsequently, the top shield is fabricated by physical deposition, electroplating, or the combination of both. A chemical mechanical polishing may be used to planerize the shield, and in the meantime, to expose the top of the nanotubes and define their height. The pinned layer is deposited onto the exposed nanotubes to complete the sensor structure as shown in FIG. 3.

Figure 5:
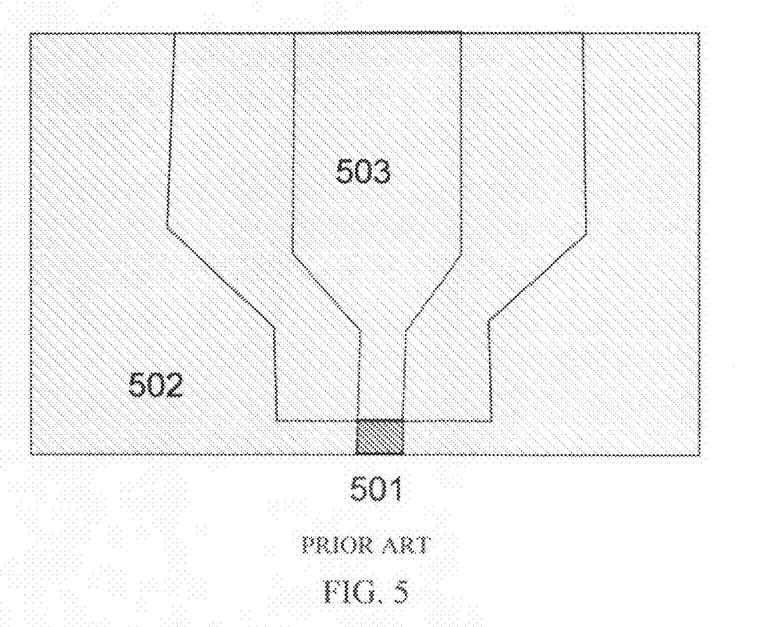
FIG. 5 shows a top view of a prior art CIP type spin valve sensor during the fabrication process. The patterned sensor film, which is at the bottom center, extends to the ABS, and is adjacent to the hard bias layers and current leads on both sides.

FIG. 5 shows a top view of a prior art CIP type spin valve sensor during the fabrication process. The patterned sensor film 501, which is at the bottom center, extends to the ABS, and is adjacent to the hard bias layers and current leads 502 on both sides. The fabrication processes usually consist of photolithography and patterning of the sensor film, deposition of hard bias layers and current leads, and liftoff of the photoresist masks. Another photolithography step and etching process are required to define the stripe height of the sensor film.

Figure 6:
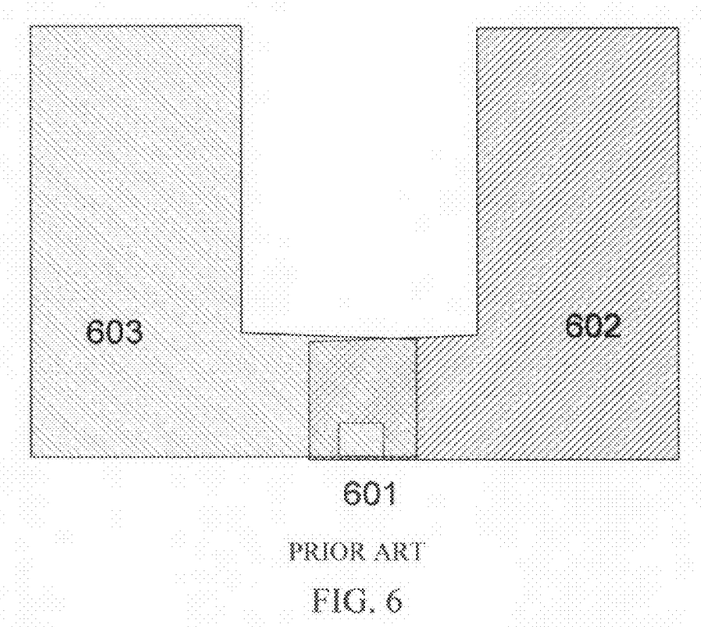
FIG. 6 shows a top view of a prior art CPP type spin valve sensor during the fabrication process. The patterned sensor film, which is at the bottom center, resides between and are in electrical contact with the top and bottom current leads.

FIG. 6 shows a top view of a prior art CPP type spin valve sensor during the fabrication process. The patterned sensor film 601, which is at the bottom center, resides between, and is in electrical contact with the top and bottom current leads 603 and 602. In the fabrication process of CPP type spin valve sensor, the bottom and top leads are constructed in separate process steps prior and after patterning the sensor film stack, respectively. The hard bias layer may also be provided in a same manner as in the CIP type spin valve.

Figure 7:
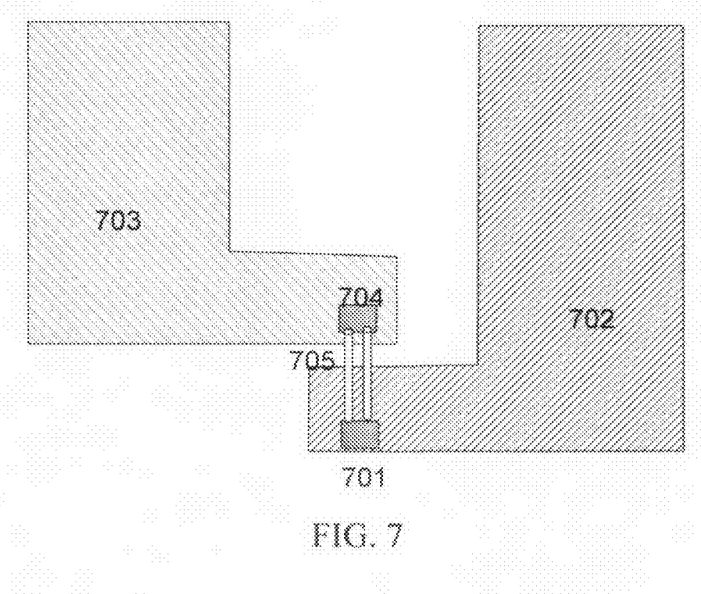
FIG. 7 illustrates a new planar nanotube spin valve structure as viewed from the top. The free layer and pinned layer, along with their respective leads, are physically separated, and have no overlap as viewed from the top. The free layer, which is patterned and exposed at the ABS, is connected to the pinned layer by in-plane nanotubes.

FIG. 7 illustrates a new planar nanotube spin valve structure as viewed from the top. The free layer 701 and pinned layer 704, along with their respective leads 702 and 703, are physically separated, and have no overlap as viewed from the top. The free layer, which is patterned and exposed at the ABS, is connected to the pinned layer by in-plane nanotubes 705. The free layer 701 may be patterned after the patterning of bottom lead 702. The pinned layer 704 may be fabricated by a liftoff process, which consists of a photolithography and a physical vapor deposition process. The top lead 703 is physically separated from the bottom lead 702, but may be fabricated in a same process step. The nanotube channels 705 are fabricated by either in-situ chemical vapor deposition at the wafer level, or by ex-situ assembly of carbon nanotubes.

Figure 8A:
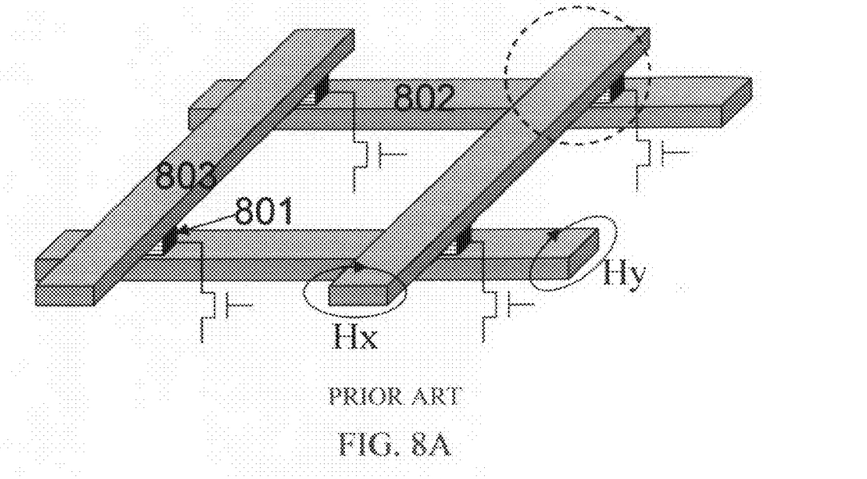
Figure 8B:
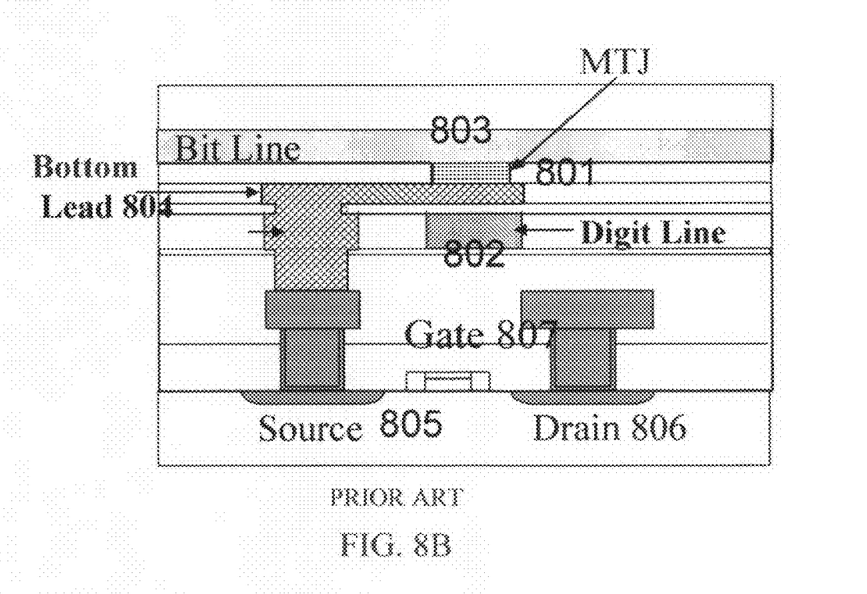

FIG. 8 illustrates a prior art magnetic random access memory (MRAM) device. A MRAM cell 801 resides at each junction of vertically 803 and horizontally oriented lines 802, as seen in FIG. 8(a). The cross-section of a MRAM cell is shown in FIG. 8(b). It is shown that a patterned magnetic tunneling junction (MTJ) 801 is sandwiched between the bit line 803 and the digit line 802. During the writing process, current pulses pass through both the bit line and the digit line to enable switching of magnetization in the free layer. A single current pulse in one the lines, however, does not generate sufficient magnetic field for the switching to occur. The reading of a recorded bit is activated by selecting the transistor associated with the MRAM cell. A sensing current is made to pass through the MTJ 801, and is fed into the source electrode 805. Whether a high or low junction resistance is detected represents either a "1" or a "0" information.

Figure 9:
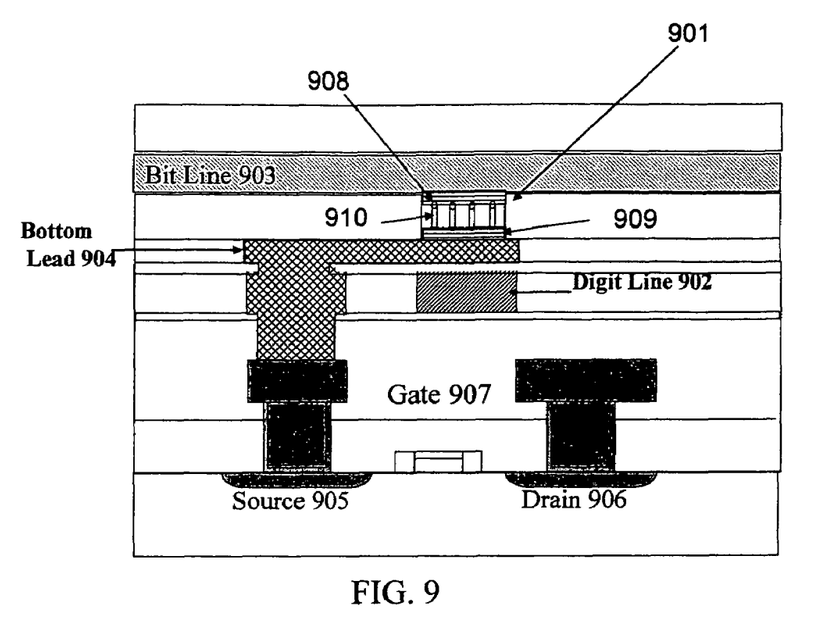
FIG. 9 illustrates the cross-section of a new MRAM cell utilizing the new in-stack nanotube spin valve. In this case, the conventional MTJ is replaced by the in-stack spin valve structure with nanotubes residing between the free and pinned layer.

FIG. 9 illustrates the cross-section of a new MRAM cell utilizing the new in-stack nanotube spin valve 901. In this case, the conventional MTJ is replaced by the in-stack spin valve structure with nanotubes 910 residing between the free and pinned layer 909 and 908. The fabrication of the in-stack nanotube spin valve consists of deposition and patterning of free layer 909, controlled growth of vertically aligned carbon nanotubes 910 onto NiFe catalyst (free layer), deposition of an insulation layer, chemical mechanical polishing to planerize the insulation layer and to expose the top of the nanotubes, and finally deposition and patterning of the pinned layer 908. During the reading operation of the MRAM cell, the sensing current passes through the nanotube channels. The ballistic transport of the spin polarized current via the nanotubes enables detection of the free layer magnetic state, which represents the stored information.

Figure 10A:
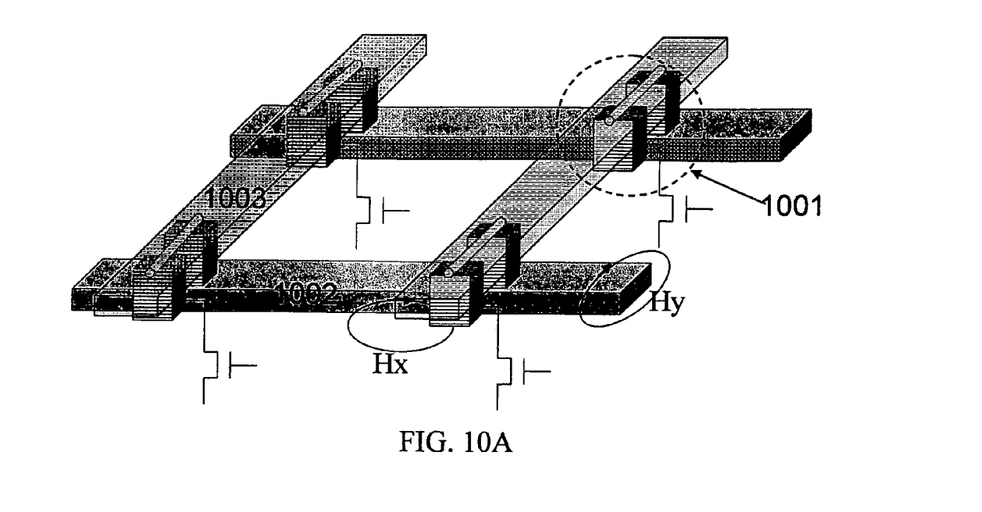
FIG. 10 illustrates the new MRAM device utilizing the new planar nanotube spin valve. In this case, the conventional MTJ stack is replaced by separate stacks of free layer and pinned layer, which are connected by in-plane nanotubes. The pinned layer is in direct electrical contact with the source of a transistor via bottom leads; whereas, the free layer is connected to the bit line. The free layer is sandwiched between the bit line and the digit line, so that it may be magnetically switched to represent different stored information.
Figure 10B:
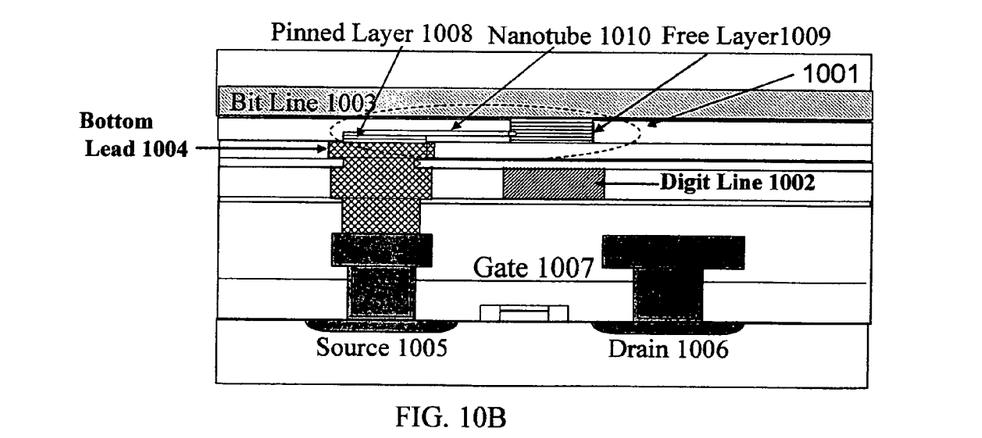

FIG. 10 illustrates the new MRAM device utilizing the new planar nanotube spin valve. In this case, the conventional MTJ stack is replaced by separate stacks of free layer 1009 and pinned layer 1008, which are connected by in-plane nanotubes 1010. The pinned layer is in direct electrical contact with the source of a transistor 1005 via bottom leads 1004; whereas, the free layer 1009 is connected to the bit line 1003. The free layer is sandwiched between the bit line and the digit line 1002, so that it may be magnetically switched to represent different stored information.

Although the invention has been described and illustrated with a certain degree of particularity, it is understood that the present disclosure has been made only by way of example, and that certain changes in the combination and arrangement of parts can be resorted to by those skilled in the art without departing from the spirit and scope of the invention, as hereinafter claimed. For example, the nanotube spin valve may consist of a single or plurality of nanotubes. The fabrication process may be varied significantly to practice the invention as will be readily appreciated by those skilled in the art.

I claim:

1. A spin valve device comprising:
   a ferromagnetic free layer whose magnetization changes in a magnetic signal field,
   a ferromagnetic pinned layer whose magnetization remains unchanged in the magnetic signal field,
   a single or a plurality of carbon nanotubes reside between said ferromagnetic free layer and said pinned layer, and are in electrical contact with the two, wherein said carbon nanotube each having a substantially cylindrical wall, having a submicron diameter, a length measured in a direction perpendicular to the diameter, and the length being greater than the diameter,
   wherein the plane of said ferromagnetic pinned layer is parallel to the plane of said free layer, and
   said carbon nanotubes are vertically aligned and perpendicular to the planes of said pinned and said free layers, and
   an electrical current passes from one ferromagnetic layer to the other via said carbon nanotubes during the device operation.

2. The spin valve device of claim 1, wherein said carbon nanotubes are single wall nanotubes.

3. The spin valve device of claim 1, wherein said ferromagnetic free layer is made of alloys selected from the group containing Ni, Fe, Co.

4. The spin valve device of claim 1, wherein said spin valve device is a magnetic recording read head.

5. The magnetic recording read head of claim 4, wherein
   said ferromagnetic free layer is between two soft magnetic shields, and
   said ferromagnetic pinned layer is not between the two soft magnetic shields, and
   said single or a plurality of vertically aligned carbon nanotubes reside between said free layer and said pinned layer, extending through the thickness of one of the shields.

6. The magnetic recording read head of claim 4, wherein the spin valve is fabricated by a process comprising:
   growing carbon nanotubes on patterned free layer by chemical vapor deposition, and
   depositing an insulation layer, and
   depositing a soft magnetic shield layer, and
   chemical mechanical polishing said shield layer and exposing the top of said carbon nanotubes, and
   depositing and patterning said ferromagnetic pinned layer.

7. The spin valve device of claim 1, wherein said spin valve is included in a magnetic random access memory (MRAM) cell.

8. The MRAM cell of claim 7, wherein the spin valve is fabricated by a process comprising:
   growing carbon nanotubes on patterned free layer by chemical vapor deposition, and
   depositing an insulation layer, and
   chemical mechanical polishing of said insulation layer and exposing the top of carbon nanotubes, and
   depositing and patterning said ferromagnetic pinned layer.

9. A spin valve device comprising:
   a ferromagnetic free layer whose magnetization changes in a magnetic signal field,
   a ferromagnetic pinned layer whose magnetization remains unchanged in the magnetic signal field,
   a single or a plurality of carbon nanotubes reside between the said ferromagnetic free layer and said pinned layer, and are in electrical contact with the two, wherein said carbon nanotubes each having a substantially cylindrical wall, having a submicron diameter, a length measured in a direction perpendicular to the diameter, and the length being greater than the diameter,
   wherein said ferromagnetic pinned layer resides substantially in the same plane of said free layer, and
   said carbon nanotubes are in-plane aligned and are substantially in the same plane of said pinned and said free layers, and
   an electrical current passes from one ferromagnetic layer to the other via said carbon nanotubes during the device operation.

10. The spin valve device of claim 9, wherein said carbon nanotubes are single wall nanotubes.

11. The spin valve device of claim 9, wherein said ferromagnetic free layer and pinned layer are made of alloys selected from the group containing Ni, Fe, Co.

12. The spin valve device of claim 9, wherein said spin valve device is a magnetic recording read head.

13. The magnetic recording read head of claim 12, wherein
   said ferromagnetic free layer is exposed to the air bearing surface, and resides between two soft magnetic shields,
   said ferromagnetic pinned layer is recessed from the air bearing surface, and does not overlap said free layer,
   said single or plurality of in-plane aligned carbon nanotubes reside between said free layer and said pinned layer, and are aligned in a direction substantially perpendicular to the air bearing surface.

14. The magnetic recording read head of claim 12, wherein the spin valve is fabricated by a process comprising:
   patterning said ferromagnetic free layer and said ferromagnetic pinned layer, and
   growing in plane aligned carbon nanotubes between said free layer and said pinned layer by chemical vapor deposition.

15. The magnetic recording read head of claim 12, wherein the spin valve fabrication processes comprising:
   patterning a ferromagnetic free layer and a ferromagnetic pinned layer, and
   assembling carbon nanotubes between said free layer and pinned layer.

16. The spin valve device of claim 9, wherein the spin valve is included in a magnetic random access memory (MRAM) cell.

17. The MRAM cell of claim 16, wherein the spin valve is fabricated by a process comprising:
   growing carbon nanotubes on patterned free layer by chemical vapor deposition, and
   depositing an insulation layer, and
   chemical mechanical polishing of said insulation layer and exposing the top of carbon nanotubes, and
   depositing and patterning said ferromagnetic pinned layer.

18. The MRAM cell of claim 16, wherein the spin valve is fabricated by a process comprising:
   patterning a ferromagnetic free layer and a ferromagnetic pinned layer, and
   assembling carbon nanotubes between said free layer and said pinned layer.

* * * * *